United States Patent [19]

Chen

[11] Patent Number: 5,401,690

[45] Date of Patent: Mar. 28, 1995

[54] METHOD FOR MAKING CIRCULAR DIODE CHIPS THROUGH GLASS PASSIVATION

[75] Inventor: Chien-Chang Chen, Hsin Tien, Taiwan, Prov. of China

[73] Assignee: Goodark Electronic Corp., Taipei, Taiwan, Prov. of China

[21] Appl. No.: 230,768

[22] Filed: Apr. 21, 1994

Related U.S. Application Data

[63] Continuation-in-part of Ser. No. 87,409, Jul. 8, 1993, abandoned.

[51] Int. Cl.6 .......................................... H01L 21/465
[52] U.S. Cl. ................................... 437/228; 437/229; 437/904; 437/249
[58] Field of Search ............... 437/226, 227, 904, 228, 437/229, 249

[56] References Cited

U.S. PATENT DOCUMENTS

4,302,531 11/1981 Cox et al. ............................ 430/317
5,202,271 4/1993 Kouzuma et al. ...................... 437/3

Primary Examiner—Olik Chaudhuri
Assistant Examiner—Richard A. Booth
Attorney, Agent, or Firm—Jacobson, Price, Holman & Stern

[57] ABSTRACT

A method for making circular diode chips which includes procedures of coating a diffused wafer with a photoresister coating and exposing it to develop the pattern; groove etching with an acid solution; removing the photoresister coating and cleaning it with deionized water; filling up the etched regions on the wafer with a glass slurry and then treating it through a glass firing process; nickel plating and sintering the wafer; mounting a sand substrate and the circular iron plates on the wafer at two opposite sides by melted wax; sand blasting the iron plate and glass substrate attached wafer and removing the iron plate so as to obtain the finished chips.

12 Claims, 4 Drawing Sheets

METHOD FOR MAKING CIRCULAR DIODE CHIPS THROUGH GLASS PASSIVATION

This application is a continuation-in-part of U.S. Ser. No. 08/087,409, filed on Jul. 8, 1993, now abandoned.

BACKGROUND OF THE INVENTION

The present invention relates to a method for making circular diode chips through glass passivation which eliminates complicated chemical solution dipping procedures, and which causes less environmental pollution problem. A circular diode chip made according to the present invention has no projecting ends, and therefore it provides stable electric properties.

Conventional diode chip production methods commonly use a laser beam to cut a circuited wafer into square chips. The square chips are then dipped in different chemical solutions so as to form diode chips. These methods have many drawbacks. Because various chemical solutions are used, waste chemical solutions will cause severe environmental pollution. Because the chips must be dipped in different chemical solutions before being finished, they may be damaged easily during the dipping process, and therefore a high defective rate becomes inevitable. Because the chips are made in a square shape, the act of discharging tends to occur at the four pointed corners, causing instability of the electric properties. Therefore, diode chips made according to the aforesaid conventional methods are not suitable for use in precise electric devices.

SUMMARY OF THE INVENTION

The present invention eliminates the aforesaid drawbacks. According to the preferred embodiment, the method comprises procedures of (a) coating a diffused wafer with a photoresister coating and exposing it to develop the pattern; (b) groove etching with an acid solution; (c) removing the photoresister coating and cleaning it with deionized water; (d) filling up the etched regions on the wafer with a glass slurry and then treating it through a glass firing process; (e) nickel plating and sintering the wafer; (f) mounting a sand substrate and circular iron plates on the wafer at two opposite sides by melted wax and an adhesive tape; (g) sand blasting the iron plate and glass substrate attached wafer; (h) removing the iron plates so as to obtain the finished chip. Because less number of chemical solutions are used, the environmental pollution problem is minimized. Because the chips made are circular, the electrical properties of the chips are stable, and therefore the chips are suitable for use in high precision electric devices.

DETAILED DESCRIPTION OF THE PREFERRED EMBODIMENT

Figure 1:
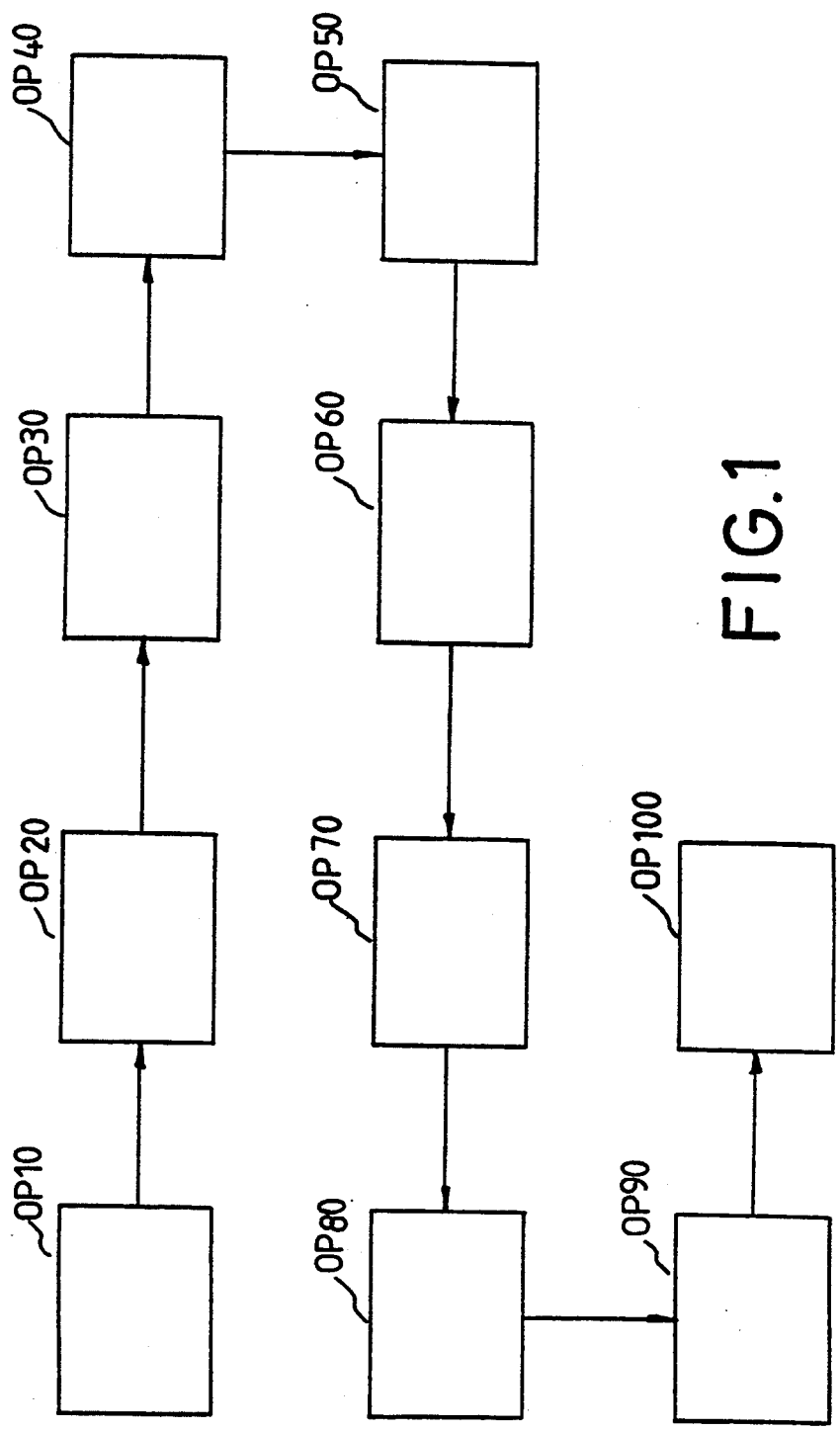
FIG. 1 is a block diagram showing a diode chip production flow chart according to the present invention.

Referring to FIG. 1, a diode chip production flow chart according to the present invention is shown which includes procedures of diffused wafer photoresister coating OP10, photo exposure and pattern OP20, groove etching OP30, photoresister removing OP40, junction clean OP50, glass slurry application OP60, glass firing OP70, nickel plating and sintering OP80, substrate and iron wafer mounting OP90, sand blast and demounting OP100.

A diffused wafer is coated with a photoresister coating OP10 and covered with a specially designed photomask, and then treated through the procedure of photo exposure and pattern OP20. The wafer is then shape formed by means of treatment with an acid solution through the procedure of groove etching OP30, and then it is treated through the procedure of photoresister removing OP40 to remove the photoresister coating by means of the application of a solvent. After the procedure of photoresister removing OP40, the wafer is treated through the procedure of junction clean OP50 to clean the etched regions formed thereon by deionized water. Then the etched regions on the wafer are filled up with a glass slurry through the procedure of glass slurry application OP60, and then inserted in a quartz tube for receiving the treatment of glass firing OP70. After the procedure of glass firing OP70, the wafer is treated through the procedure of nickel plating and sintering OP80 to become plated with a layer of nickel, then sintered, and then plated with an additional layer of nickel. At the same time, a glass substrate is prepared and covered with a layer of white wax at the top, and then placed on an electric hot plate for heating. As the white wax is melted, the nickel plated wafer obtained from the aforesaid procedures is placed on the glass substrate and covered with the melted white wax. Then, an adhesive tape with many small circular iron plates adheres to the top of the wafer. Therefore, the procedure of substrate and iron wafer mounting OP90 is completed. Then the wafer with the substrate and the circular iron plates adhered thereon are removed from the electric hot plate and then placed on a flat plate for cooling in air. After cooling, the adhesive tape is removed from the circular iron plates that adhere to the top of the wafer. Then the semi-finished product is treated through the procedure of sand blasting and demounting OP100. During the procedure of sand blasting and demounting, the semi-finished product is engraved by a blast of air containing sand in a sand-blast machine. After the process of sand blasting, the near-finished chips are then dipped in a solvent solution for cleaning. After cleaning, the finished products are obtained and the circular iron plates are removed by a magnet.

Figure 2:
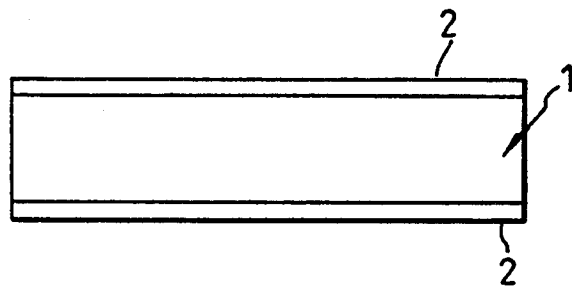
FIG. 2 is a plain view showing a wafer coated with a layer of photoresister coating according to the present invention.

Referring to FIG. 2, during the procedure of diffused wafer photoresister coating OP10, a photoresister 2 is prepared, and the revolving speed of the furnace is preset. The diffused wafers used in the present invention have a P-N junction. The depth of the P region is typically between about 1.2–1.5 mils. The N+ region which is the region of the wafer that has been diffused with phosphorus typically has a depth of between about 4.5–5 mils. The diffused wafers 1 are placed on the wafer rack and then dried in the furnace (at 100° C. for a half-hour). After drying, each wafer 1 is respectively coated with the photoresister 2 and properly marked for easy identification of P or N side. The photoresister coated wafers 1 are put in the furnace again for drying at about 75° C. for a half-hour. After drying, it proceeds to the next procedure of photo exposure and pattern OP20.

Figure 3:
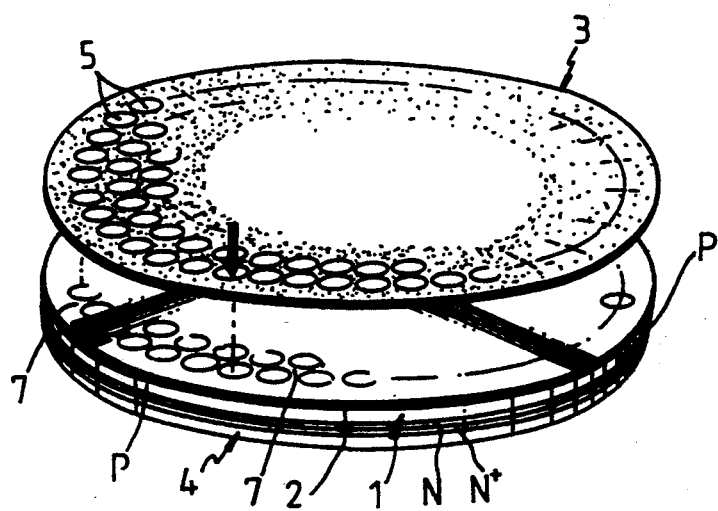
FIG. 3 illustrates the photoresister coated wafer placed above a glass plate and covered with a photomask for exposure.

Referring to FIG. 3, during the procedure of photo exposure and pattern OP20, the P side of each photoresister coated wafer 1 is disposed at the top and covered with a photomask 3, the photomask 3 has a number of light permeating circles 5 on its top to let the light pass through, then photoresister coated wafer 1 is placed on a glass plate 4. The photomask 3, the respective wafer 1, and the glass plate 4 are firmly retained in a stack and sent to a double-side exposure machine to let the photoresister coating on two opposite sides of each wafer 1 be photosensitized for 10 seconds. After exposure, the wafers 1 (each having circular diaphragms on the respective P side) are placed on the wafer rack and then sent to the furnace for baking at 100° C. for about half hour. After drying, the wafers 1 are removed from the furnace, then respectively treated by n-butyl acetate and an auxiliary test agent (methyl benzene and acetone) for 15 seconds each to develop the pattern. Then, it proceeds to the next procedure of groove etching OP30.

Figure 4:
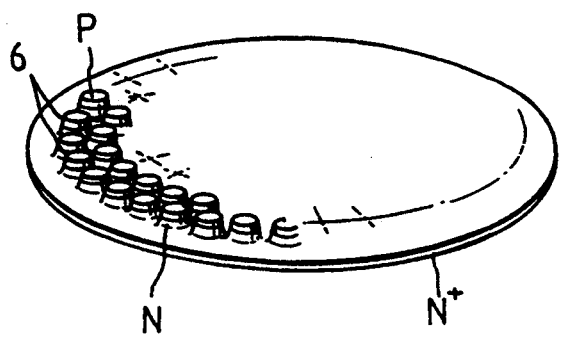
FIG. 4 is a perspective view of the wafer after groove etching.

Referring to FIG. 4, during the groove etching OP30, a mixed acid solution is prepared in an acid trough, and maintained at 10° C. The preferred mixed acid solution of the present invention contains nine portions of nitric acid, nine portions of glacial acetic acid, fourteen portions of hydrofluoric acid, and four portions of sulfuric acid wherein portions are "by volume". The wafer rack with the pattern developed wafers 1 are dipped in the mixed acid solution within the acid trough for etching. Five minutes after etching, the wafer rack with the etched wafers 1 are dipped in a water trough and washed by running water for five to fifteen minutes. Thus, etched regions 6 are formed on the top side of the photomask 3 around the area which has been photosensitized through the light permeating circles 5 on the respective photomask 3, leaving the photosensitized portion on the P side of the wafer raised relative to the part of the wafer that was not photosensitized. These raised regions are shaped like truncated cones and correspond to the light permeating circles 5. The depth of etching is examined during the process. As the depth of the etched regions 6 reaches the N+ side of the lower part of wafer 1, the etching procedure is finished, and then the wafers 1 are sent to the next production procedure of photoresister removing OP40.

During the procedure of photoresister removing OP40, the etched wafers 1 are dipped in a solution containing hydrogen peroxide and sulfuric acid to remove the photoresister coating. As the photoresister coating has been removed, the wafers 1 are sent to the next production procedure of junction clean OP50.

During the procedure of junction clean OP50, the wafers 1 are washed by deionized water, then treated by high-frequency ultrasonic waves for five minutes to remove water drops, then dehydrated by IPA (isopropanolamine) for five minutes. After dehydration the wafers 1 are placed on an electric hot plate and heated at 100° C. When dried, the wafers 1 are sent to the next procedure of glass slurry application OP60.

Figure 5:
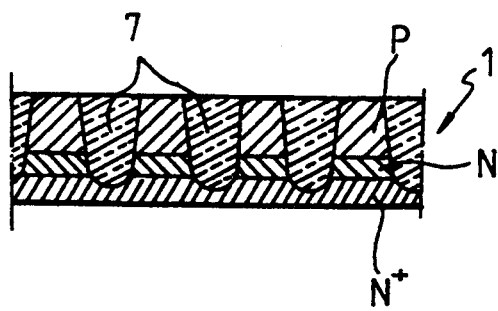
FIG. 5 is a sectional view of the wafer showing the etched regions filled up with a glass slurry.

Referring to FIG. 5, during the procedure of glass slurry application OP60, a glass slurry 7 is prepared by mixing glass powder with a suitable amount of deionized water and 5% by weight of adhesive agent wherein a suitable amount is one in which the glass powder can be dissolved without any sediment. A scraping blade made of flexible plastics (PU) is applied to fill the prepared glass slurry 7 in the etched regions 6 and to keep the surface of the wafers 1 clean. As the etched regions 6 are respectively filled up with the glass slurry 7, the wafers 1 are put in the wafer rack and then delivered to the next procedure of glass firing OP70.

During the procedure of glass firing OP70, diffused quartz tubes are heated in a programmable sintering furnace to 720° C., the wafers 1 thus obtained from the antecedent procedure are respectively put in the quartz tubes for sintering. The quartz tubes are respectively filled with nitrogen to protect the wafers 1 against oxidation so that the electric properties of the wafers 1 will not be affected. About one hour after the sintering process, the glass slurry 7 hardens and becomes glassy. Then, the wafers 1 are removed from the quartz tubes and cleaned, and then the wafers 1 are sent to the next procedure of nickel plating and sintering OP80.

Figure 6:
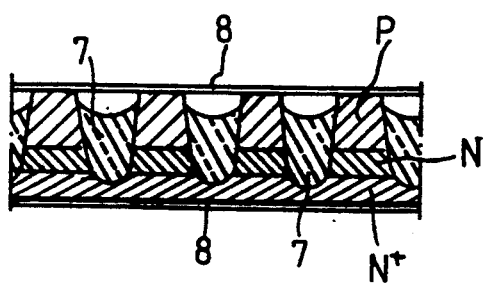
FIG. 6 is a sectional view of the wafer showing a nickel coating plated.

Referring to FIG. 6, during the procedure of nickel plating and sintering OP80, an electroplating solution of nickel is prepared and heated to about 75° C.; the wafers 1 obtained from the antecedent procedure are surface activated, then carried in a rack, and then put with the rack in the electroplating solution for covering with a layer of nickel coating 8 by electroplating. The nickel plated wafers 1 are then washed by deionized water, and then put in a IPA (isopropanolamine) trough for dehydration. After dehydration, the wafers 1 are placed on an electric hot plate and heated to dry. Then, the well dried wafers are put in quartz tubes being heated to about 650° C. and filled with nitrogen for sintering. Then the sintered wafers 1 are nickel plated by electroplating secondarily, and then sent to the next procedure of substrate and iron wafer mounting OP90.

Figure 7:
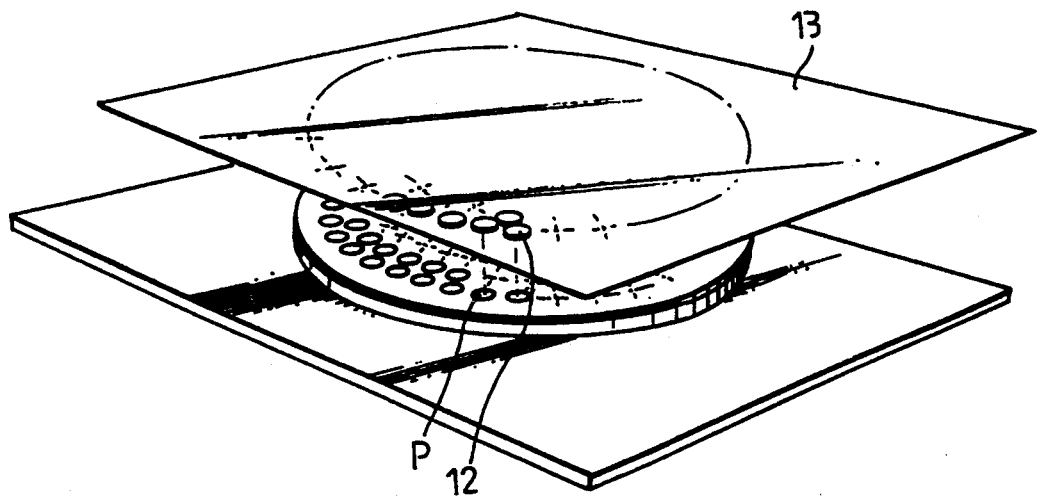
FIG. 7 illustrates the circular iron plates 12 in preparation for adherence to the right plates on the wafer 1.
Figure 8:
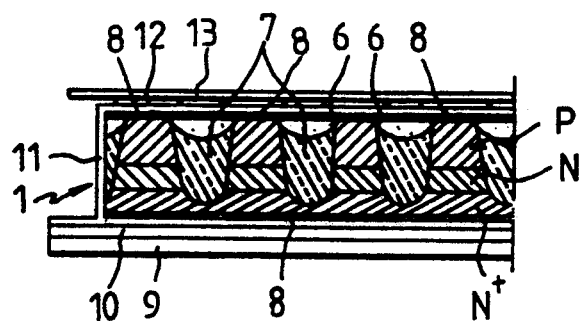
FIG. 8 is a sectional view of the wafer 1 adhering to the small circular iron plates 12 and a glass substrate 10.
Figure 9:
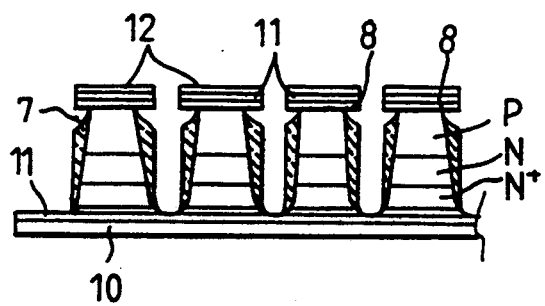
FIG. 9 is a sectional view of the circular diode chips 14 still attached to the glass substrate and wax that are formed after the process of sand blasting.

Referring to FIGS. 7 and 8 during the procedure of substrate and iron wafer mounting OP90, glass substrates 10 are placed on an electric hot plate 9 and heated to 120° C. to melt a proper amount of white wax 11 being placed on each glass substrate 10, then the nickel plated wafers 1 with N side face down are respectively mounted on the glass substrate 10 which are covered by the melted white wax 11, and then the outside surface of each nickel plated wafer 1 is fully covered with the melted white wax 11, and then an adhesive tape that has many well designed small circular iron plates 12 on the bottom is accurately adhered to the wafer 1 respectively. Pressure may be applied to the iron plates 12 to keep the iron plates 12 and the respective wafer 1 tightly adhered together.

Each small circular iron plate 12 with an area slightly larger than the area of each photosensitized part is adhered to the adhesive tape 13. The adhesive tape 13 and the circular iron plates 12 are then adhered to the wafer 1, and each of the photosensitized part on the P side of the wafer 1 is accurately covered by a small circular iron plate 12 respectively. Then the wafer 1 with the iron plates 12 and glass substrates 10 are removed from the electric hot plate and placed on a flat plate for cooling in air. After cooling, the adhesive tapes are respectively removed from the semi-finished products, and the semi-finished products are sent to the next procedure of sand blasting and demounting OP100.

During the procedure of sand blasting and demounting, the semi-finished products are put in a programmable sand-blast machine one by one and the face with circular iron places 12, of each of the semi-finished product is disposed against the direction of the blast for engraving. After the process of sand blasting, the part of the wafer 1 that is not protected by the circular iron plates 12 has been pierced through by sand blasting. Since an area of glass slurry 7 in the etched region 6 is covered by the circular iron plates 12, so these areas are protected during the sand blasting. What is formed is a number of near-finished circular chips that can be seen on the glass substrate 10. The near-finished circular chips and the glass substrate 10 are dipped in a solvent solution, and then a high-frequency vibrator is used to remove water from the near-finished circular chips. The circular iron plates 12 are respectively removed from the near-finished circular chips by means of the application of magnetic attraction, and what is left are circular diode chips.

What is claimed is:

1. A method for making circular diode chips using a wafer with diffused P and N conductivity type sides, the interface of both diffused sides forming a junction, the N-type conductivity side including an N and N+ region, comprising the steps of:
    (a) coating said diffused wafer with a photoresist coating and covering portions of said photoresist with a photomask;
    (b) sending the wafer with the photomask to an exposure machine for developing a pattern thereon;
    (c) groove etching the unphotosensitized part of the wafer by an acid solution until reaching said N+ region;
    (d) removing the photoresist coating from the wafer;
    (e) cleaning the wafer with a solution;
    (f) filling up said etched grooves formed on the wafer with a glass slurry;
    (g) glass firing the wafer;
    (h) electroplating the wafer with a layer of nickel and sending it to a quartz tube for sintering followed by electroplating the sintered wafer with an additional layer of nickel;
    (i) preparing a glass substrate on an electric hot plate and melting wax on the glass substrate;
    (j) adhering the nickel plated wafer to the glass substrate and covering the melted wax on the resultant structure;
    (k) adhering an adhesive tape with circular iron plates accurately to the wafer;
    (l) removing the wafer from the electric hot plate for air cooling, and then removing the adhesive tape from the wafer;
    (m) sand blasting the glass substrate and iron plate attached wafer to obtain near-finished circular chips;
    (n) dipping the near-finished circular chips in a solution for cleaning after the sand blasting step; and
    (o) removing the circular iron plates from the near-finished circular chips by magnetic attraction so as to obtain the finished circular diode chips.

2. The method of claim 1 wherein said acid solution for groove etching contains nine portions by volume of nitric acid, nine portions by volume of glacial acetic acid, fourteen portions by volume of hydrofluoric acid, and four portions by volume of sulfuric acid.

3. The method of claim 1 wherein said glass slurry is prepared by mixing glass powder with deionized water and 5% by weight of adhesive agent.

4. The method of claim 1 wherein each of said circular iron plates that has an area slightly larger than the area of each photosensitized part of said wafer is adhered with the adhesive tape to the wafer wherein the top of each of said photosensitized part of said wafer is accurately covered by a small circular iron plate respectively.

5. The method of claim 1 wherein the solution for cleaning is a solvent solution.

6. The method of claim 1 wherein the N+ region is located on a lower part of the wafer.

7. The method of claim 1 wherein the photoresist coating is removed from the wafer by means of the application of a solvent.

8. The method of claim 1 wherein the step of cleaning the wafer is by a solution of deionized water.

9. The method of claim 1 wherein the step of glass firing the wafer comprises inserting the wafer into a quartz tube.

10. The method of claim 1 wherein the melted wax is white.

11. The method of claim 1 wherein the wafer is photosensitized on the P type conductivity side.

12. The method of claim 7 wherein said solvent for removing said photoresist coating is a solution prepared by mixing hydrogen peroxide with sulfuric acid.

* * * * *